US009818619B2

(12) United States Patent
Kim et al.

(10) Patent No.: US 9,818,619 B2
(45) Date of Patent: Nov. 14, 2017

(54) CARRIER HEAD

(71) Applicant: Samsung Electronics Co., Ltd., Suwon-si, Gyeonggi-do (KR)

(72) Inventors: Jongbok Kim, Suwon-si (KR); Junho Ban, Hwaseong-si (KR); Sangseon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 219 days.

(21) Appl. No.: 14/747,200

(22) Filed: Jun. 23, 2015

(65) Prior Publication Data

US 2016/0020133 A1  Jan. 21, 2016

(30) Foreign Application Priority Data

Jun. 23, 2014 (KR) .................. 10-2014-0076526

(51) Int. Cl.
*B24B 37/30* (2012.01)
*H01L 21/306* (2006.01)
*B24B 37/32* (2012.01)
*B24B 37/10* (2012.01)

(52) U.S. Cl.
CPC ........ *H01L 21/30625* (2013.01); *B24B 37/30* (2013.01); *B24B 37/10* (2013.01); *B24B 37/32* (2013.01)

(58) Field of Classification Search
CPC ......... B24B 37/04; B24B 37/10; B24B 37/30; B24B 37/32; B24B 41/06
See application file for complete search history.

(56) References Cited

U.S. PATENT DOCUMENTS

| | | |
|---|---|---|
| 5,476,414 A | 12/1995 | Hirose et al. |
| 5,643,061 A * | 7/1997 | Jackson ............... B24B 37/30 451/288 |
| 5,762,544 A | 6/1998 | Zuniga et al. |
| 6,386,955 B2 | 5/2002 | Zuniga et al. |
| 6,398,906 B1 | 6/2002 | Kobayashi et al. |
| 6,409,585 B1 | 6/2002 | Oowada |
| 6,435,949 B1 | 8/2002 | Katsuoka et al. |
| 6,435,956 B1 | 8/2002 | Ohwada et al. |
| 6,443,821 B1 | 9/2002 | Kimura et al. |
| 6,517,415 B2 | 2/2003 | Govzman et al. |

(Continued)

FOREIGN PATENT DOCUMENTS

| | | |
|---|---|---|
| JP | 11-333712 | 12/1999 |
| JP | 2003-025217 | 1/2003 |

(Continued)

*Primary Examiner* — Timothy V Eley
(74) *Attorney, Agent, or Firm* — Myers Bigel, P.A.

(57) ABSTRACT

Provided is a carrier head. The carrier head includes: a body having a ring shape, wherein a first locking part is formed on an external surface of the body; a support unit surrounding lateral and lower parts of the body to be elevatably coupled to the body, wherein a second locking part vertically facing the first locking part is formed on an internal surface of the support unit; a regulating member located in a space between the first locking part and the second locking part; a retainer ring having a ring shape and located at the external bottom of the support unit; and an elevating unit coupling the retainer ring to the support unit to enable a height to be regulated relative to the support unit.

17 Claims, 11 Drawing Sheets

(56) References Cited

U.S. PATENT DOCUMENTS

| | | | |
|---|---|---|---|
| 6,666,756 B1 * | 12/2003 | Travis | B24B 49/16 451/283 |
| 6,722,965 B2 | 4/2004 | Zuniga et al. | |
| 6,890,402 B2 | 5/2005 | Gunji et al. | |
| 6,957,998 B2 | 10/2005 | Togawa | |
| 6,966,822 B2 | 11/2005 | Kajiwara et al. | |
| 7,033,252 B2 * | 4/2006 | Fuhriman | B24B 37/30 451/288 |
| 7,156,725 B2 | 1/2007 | Togawa et al. | |
| 7,217,175 B2 | 5/2007 | Togawa | |
| 7,326,103 B2 | 2/2008 | Sakurai et al. | |
| 7,357,699 B2 | 4/2008 | Togawa et al. | |
| 7,465,214 B2 | 12/2008 | Togawa et al. | |
| 7,632,173 B2 | 12/2009 | Togawa et al. | |
| 7,635,292 B2 | 12/2009 | Togawa et al. | |
| 7,654,888 B2 * | 2/2010 | Zuniga | B24B 37/32 451/288 |
| 7,854,646 B2 | 12/2010 | Togawa et al. | |
| 7,967,665 B2 | 6/2011 | Yasuda et al. | |
| 8,002,607 B2 | 8/2011 | Fukuda et al. | |
| 8,070,560 B2 | 12/2011 | Yasuda et al. | |
| 8,100,743 B2 | 1/2012 | Nabeya et al. | |
| 8,152,594 B2 | 4/2012 | Saito et al. | |
| 8,292,694 B2 | 10/2012 | Togawa et al. | |
| 8,357,029 B2 | 1/2013 | Fukushima et al. | |
| 8,388,412 B2 | 3/2013 | Prabhu et al. | |
| 8,460,067 B2 | 6/2013 | Chen et al. | |
| 8,485,866 B2 * | 7/2013 | Yasuda | B24B 37/32 451/288 |
| 8,845,396 B2 * | 9/2014 | Nabeya | B24B 37/30 451/287 |
| 8,858,302 B2 | 10/2014 | Kim | |
| 2006/0194519 A1 | 8/2006 | Fuhriman et al. | |
| 2007/0010181 A1 | 1/2007 | Spiegel | |
| 2007/0212988 A1 * | 9/2007 | Nabeya | B24B 49/16 451/287 |
| 2014/0357164 A1 | 12/2014 | Nabeya et al. | |
| 2015/0328743 A1 * | 11/2015 | Nabeya | B24B 37/32 451/288 |
| 2016/0082571 A1 * | 3/2016 | Chen | B24B 37/32 451/364 |

FOREIGN PATENT DOCUMENTS

| | | |
|---|---|---|
| KR | 10-2000-0048284 A | 7/2000 |
| KR | 10-0715384 B1 | 10/2000 |
| KR | 10-0271902 B1 | 12/2000 |
| KR | 10-2001-0024969 A | 3/2001 |
| KR | 10-2001-0033796 A | 4/2001 |
| KR | 10-2001-0051711 A | 6/2001 |
| KR | 10-0363070 B1 | 2/2003 |
| KR | 10-0366425 B1 | 2/2003 |
| KR | 10-0366919 B1 | 3/2003 |
| KR | 10-1164139 B1 | 5/2004 |
| KR | 10-0638290 B1 | 10/2006 |
| KR | 10-0694904 B1 | 3/2007 |
| KR | 10-0712584 B1 | 5/2007 |
| KR | 10-2007-0091186 A | 9/2007 |
| KR | 10-0870941 B1 | 12/2008 |
| KR | 10-0876381 B1 | 12/2008 |
| KR | 10-0898999 B1 | 5/2009 |
| KR | 10-1066530 B1 | 6/2009 |
| KR | 10-0914988 B1 | 9/2009 |
| KR | 10-0916829 B1 | 9/2009 |
| KR | 10-0939096 B1 | 1/2010 |
| KR | 10-2010-0131973 A | 12/2010 |
| KR | 10-1044738 B1 | 6/2011 |
| KR | 10-1053192 B1 | 8/2011 |
| KR | 10-1063432 B1 | 9/2011 |
| KR | 10-1081415 B1 | 11/2011 |
| KR | 10-1115688 B1 | 11/2011 |
| KR | 10-1116619 B1 | 11/2011 |
| KR | 10-1090951 B1 | 12/2011 |
| KR | 10-1095605 B1 | 12/2011 |
| KR | 10-1106202 B1 | 1/2012 |
| KR | 10-2012-0025446 A | 3/2012 |
| KR | 10-1148147 B1 | 5/2012 |
| KR | 10-1150913 B1 | 5/2012 |
| KR | 10-1151766 B1 | 5/2012 |
| KR | 10-2012-0133320 | 12/2012 |
| KR | 10-1214506 B1 | 12/2012 |
| KR | 10-1282910 B1 | 7/2013 |

* cited by examiner

3400a

3400b

CARRIER HEAD

CROSS-REFERENCE TO RELATED APPLICATIONS

This U.S. non-provisional patent application claims priority under 35 U.S.C. §119 to Korean Patent Application No. 10-2014-0076526, filed Jun. 23, 2014, the entire contents of which are hereby incorporated herein by reference.

FIELD

The present invention disclosed herein relates to a chemical mechanical polishing apparatus, a carrier head and a wafer polishing method.

BACKGROUND

A process of manufacturing a semiconductor device includes a deposition process of forming a thin-film layer on a wafer and an etching process of forming a fine circuit pattern on the thin-film layer. Until a desired circuit pattern is formed on the wafer, these processes are repeated and, and after the circuit pattern is formed, many wrinkles may be generated on the surface of the wafer. Recently, as the semiconductor device has multiple layers with high integration, the number of wrinkles on the surface of the wafer and the height difference among them have increased. However, since the unevenness of the surface of the wafer may cause a problem such as defocusing in a photolithography process, regular polishing may be needed in order to make the surface of the wafer even.

There are various surface planarization technologies in order to make the surface of the wafer even. Among others, a chemical mechanical polishing apparatus is mostly used which may provide excellent evenness in a wide area in addition to a narrow area. The chemical mechanical polishing device includes a carrier head that applies pressure to a polishing pad while supporting the wafer.

SUMMARY

The present invention provides a carrier head that may efficiently support a wafer, a chemical mechanical polishing apparatus, and a wafer polishing method.

Embodiments of the present invention provide carrier heads including: a body having a ring shape, wherein a first locking part is formed on an external surface of the body; a support unit surrounding lateral and lower parts of the body to be elevatably coupled to the body, wherein a second locking part vertically facing the first locking part is formed on an internal surface of the support unit;

a regulating member located in a space between the first locking part and the second locking part;

a retainer ring having a ring shape and located at the external bottom of the support unit; and an elevating unit coupling the retainer ring to the support unit to enable a height to be regulated relative to the support unit.

In other embodiments of the present invention, methods of polishing a wafer include: placing a carrier head to be spaced at a first set distance apart upwards from a top of a polishing pad, wherein the carrier head includes a body and a support unit, wherein the support unit is coupled to the body to elevate relative to the body, a retainer ring is arranged at the external bottom of the support unit, and a membrane member is coupled to a bottom of the support unit next to the retainer ring; enabling the support unit to descend relative to the body to enable the retainer ring to be spaced at a second set distance apart upwards from a top of the polishing pad; and enabling the retainer ring to descend relative to the body to enable the retainer ring to be in contact with the polishing pad.

In still other embodiments of the present invention, wafer polishing methods include providing a ring-shaped first regulating member; providing a second regulating member having a perimeter corresponding to the first regulating member and a height different from the first regulating member; and placing one of the first regulating member and the second regulating member between a first locking part and a second locking part of a carrier head including a body having the first locking part on the external surface and a support unit coupled to the body through the second locking part provided on the internal surface to be capable of elevating relative to the body.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
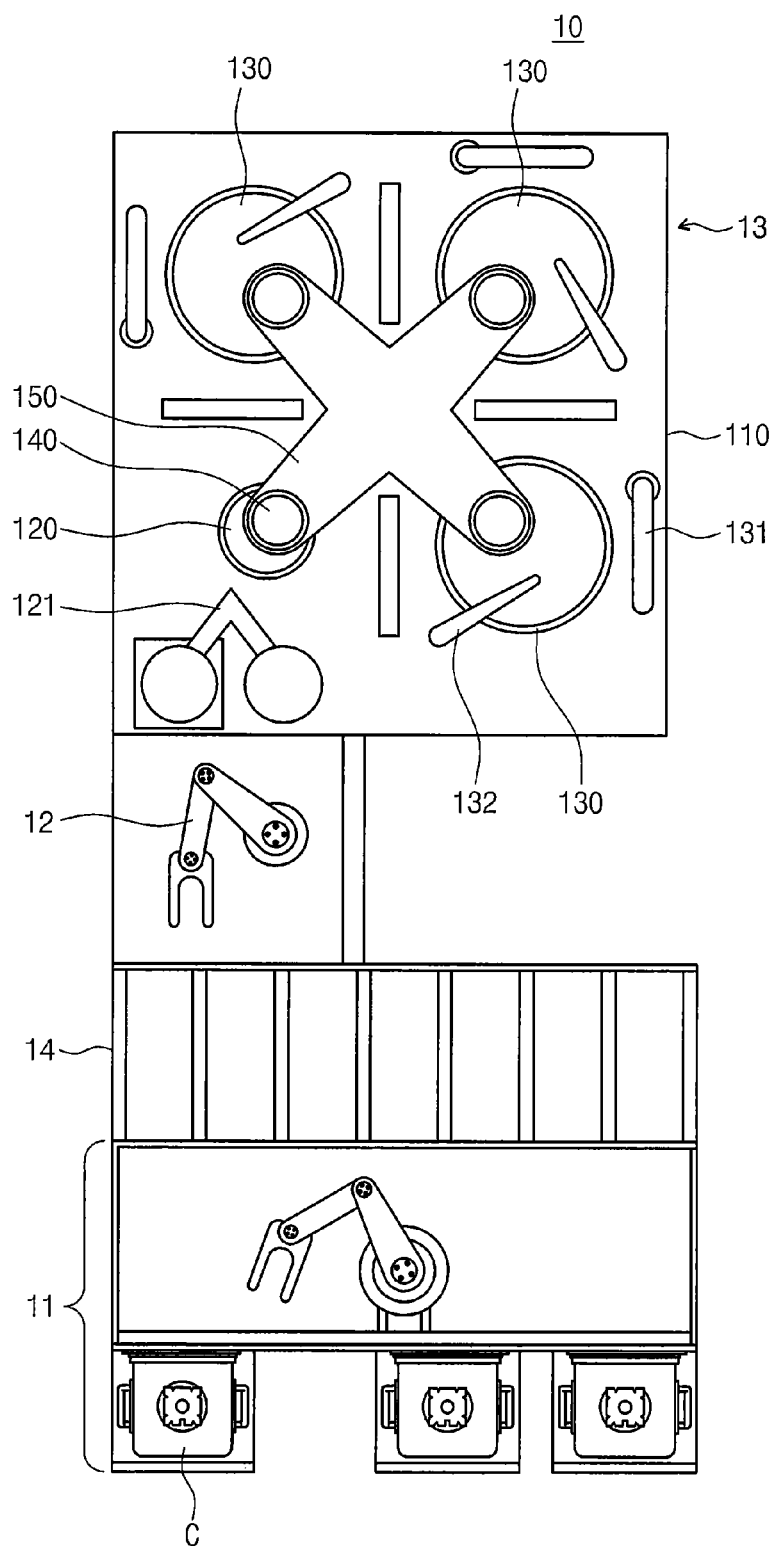
FIG. 1 is a plan view of a chemical mechanical polishing apparatus according to an embodiment of the present invention.

Embodiments of the present invention are described below in more detail with reference to the accompanying drawings. The embodiments of the present invention may be implemented in many forms, and it should not be construed that the scope of the present invention is limited to the following embodiments. The embodiments are provided to more fully explain the present invention to a person skilled in the art. Thus, the shapes of elements in the drawings are exaggerated to emphasize a more clear description.

FIG. 1 is a plan view of a chemical mechanical polishing apparatus according to an embodiment of the present invention.

Referring to FIG. 1, the chemical mechanical polishing (CMP) apparatus includes an index unit 11, a transfer robot 12, a polishing unit 13, and a cleaning device 14.

The index unit provides a space in which a cassette C storing a wafer is placed. Also, the index unit 11 performs a function of putting the wafer out of the cassette C and to deliver the wafer to the transfer robot 12 or putting, into the cassette C, a wafer on which a polishing process has been completed.

The transfer robot 12 is arranged between the index unit 11 and the polishing unit 13 and transfers the wafer between the index unit 11 and the polishing unit 13.

Figure 2:
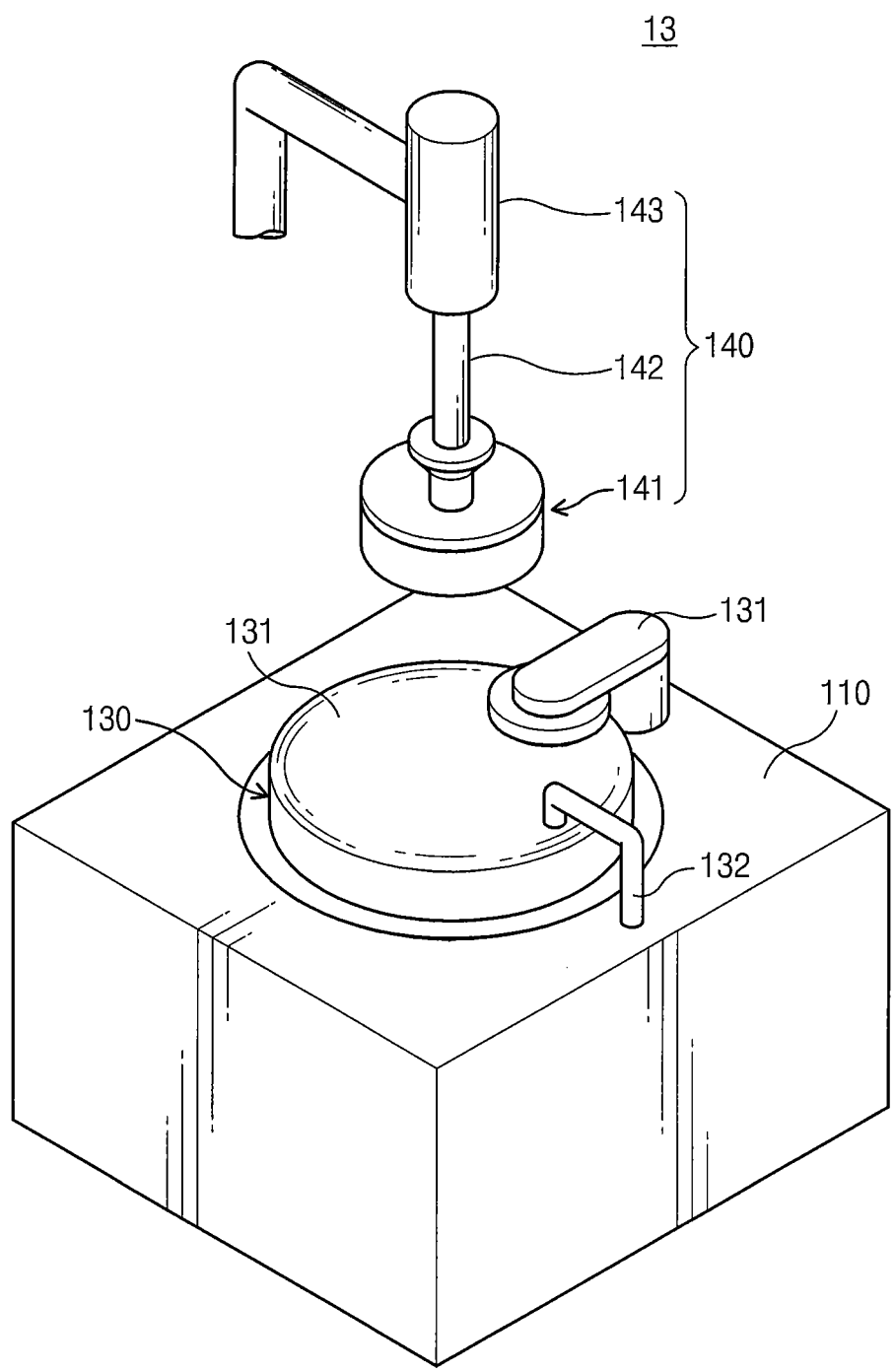
FIG. 2 is a perspective view of a portion of a polishing unit in FIG. 1.

FIG. 2 is a perspective view of a portion of the polishing unit in FIG. 1;

Referring to FIGS. 1 and 2, the polishing unit 13 includes a base 110, a rod cup 120, a platen 130, and a carrier head assembly 140.

The base 110 provides the lower structure of the polishing unit 13. The rod cup 120 is provided on the top of the base 110. The rod cup 120 may be located to be adjacent to the transfer robot 12. The rod cup 120 provides a space in which the wafer temporarily stands by. An exchanger 121 is provided between the rod cup 120 and the transfer robot 12 on the top of the base 110. A wafer transferred from the index unit 11 by the transfer robot 12 is placed on the exchanger 121 which transfers the wafer to the rod cup 120.

The platen 130 may be provided in plurality on the top of the base 110. When the platen 130 is provided in plurality, the platens 130 and the rod cup 120 may be located on circumference. Each of the platens 130 is rotatably connected to the upper part of the base 110. For example, the platen 130 may be connected to a motor that is provided with the base 110. The polishing pad 131 may be located on the top of the platen 130 to be supported by the platen 130, and may be rotated with the platen 130 during a process. The polishing pad 131 is provided as a flat plate having a certain thickness. The polishing pad 131 is a part being in direct contact with the wafer and mechanically polishing the wafer and has a rough surface.

The base 110 is provided with a pad conditioner 133 that is adjacent to each platen 130. The pad conditioner 133 maintains the state of the polishing pad 131 so that a substrate is effectively polished while a polishing process is performed.

The base 110 is provided with a slurry supply arm 132 that is adjacent to each platen 130. The slurry supply arm 132 supplies, to the surface of the polishing pad 131, slurry that may include reactant (deionized water for oxidation polishing), wear particles (silicon dioxide for oxidation polishing), and chemical reactive catalyst (potassium hydroxide for oxidation polishing).

The carrier head assembly 140 includes a carrier head 141, a driving shaft 142, and a driving motor 143.

The carrier head assembly 140 is located over the platen 130 and the rod cup 120. The carrier head 141 adheres and fixes a wafer so that the polishing surface of the wafer faces the polishing pad, and applies pressure to the polishing pad 131 during a process. The driving motor 143 provides power rotating the carrier head 141 during a process. The driving motor 143 and the carrier head 141 are connected by the driving shaft 142. The carrier head 141 may be provided to correspond to the numbers of the platens 130 and the rod cups 120. The carrier head 141 is coupled to a support frame 150. The support frame sequentially moves the carrier head 141 to the rod cup 120 and then to each platen 130. Thus, after taking a wafer out of the rod cup 120, each carrier head 141 polishes the wafer, moving along one or more platens 130. In addition, a wafer on which polishing has been completed is returned to the rod cup 120.

The cleaning device 14 is located to be adjacent to the index unit 11 and the transfer robot 12. After polishing, the wafer located at the rod cup 120 is transferred to the cleaning device 14 through the exchanger 121 and the transfer robot 12. The cleaning device 14 washes dirty materials off a polished wafer. When a washed-off wafer is returned to the index unit 11 and enters the cassette C, the polishing process is completed.

Figure 3:
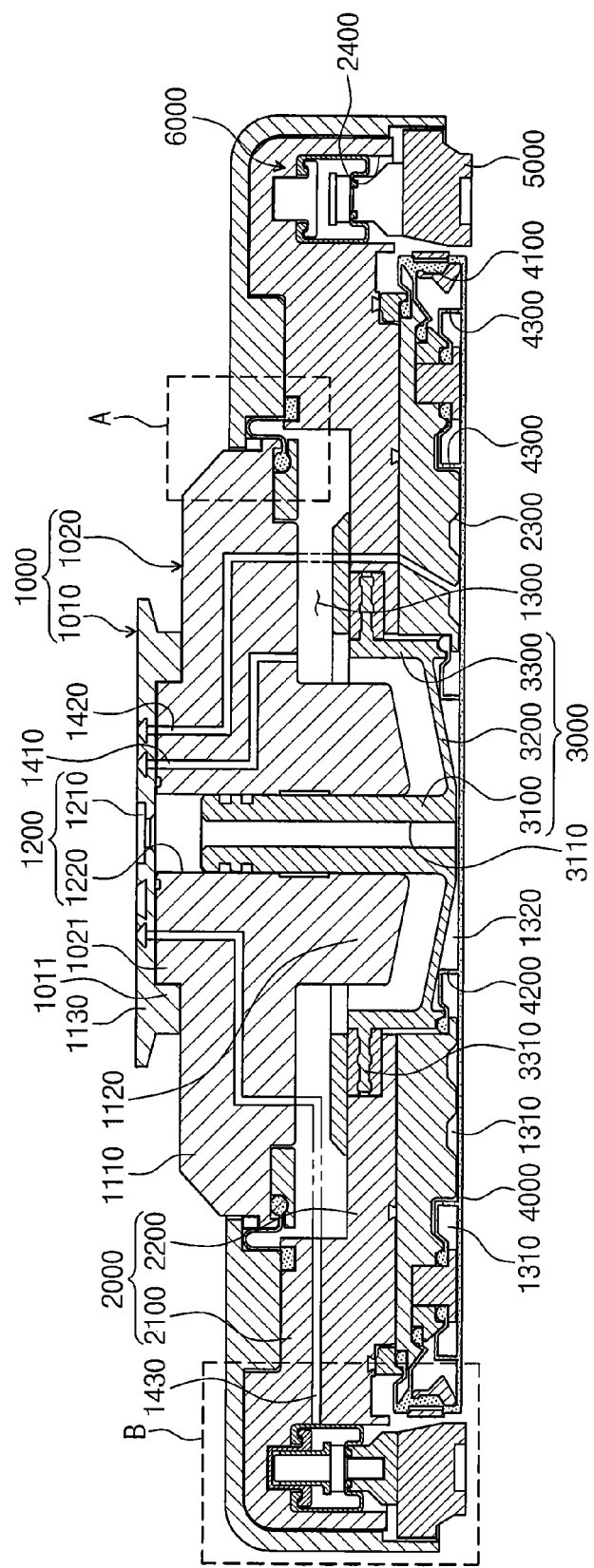
FIG. 3 is a cross-sectional view of a carrier head in FIG. 2.

FIG. 3 is a cross-sectional view of the carrier head in FIG. 2.

Referring to FIG. 3, the carrier head 141 includes a body 1000, a support unit 2000, and a guide member 3000.

The body 1000 provides the upper and central structures of the carrier head 141. The body 1000 is connected to the driving shaft 142 and rotated by power provided by the driving motor 143. The body 1000 may be roughly provided in a cylinder shape. A vertical hole is formed in the central part of the body 1000. The upper and lower areas of the body 1000 may have different perimeters. In particular, the body 1000 may include a first area 1110 occupying the upper part of the body and having a set perimeter, and a second area 1120 occupying the lower part of the body and having a perimeter smaller than the first area 1110. In addition, the body 1000 may further include a connection unit 1130 located at the upper part of the first area 1110 and connected to the driving shaft 142.

Also, the connection portion 1130 may be not provided and the top of the first area 1110 may be connected to the driving shaft 142.

The body 1000 may be provided by the coupling of a plurality of lower components. In particular, the body 1000 may include a first body 1010 and a second body 1020. The first body 1010 may form the connection unit 1130. In addition, the second body 1020 may form the first area 1110 and the second area 1120. The bottom of the first body 1010 may have a first step portion 1011 and the top of the second body 1020 may have a second step portion 1021 having a shape corresponding to the first step portion 1010. In addition, the first body 1010 and the second body 1020 may be coupled in such a manner that the first step portion 1011 and the second step portion 1021 are located to engage each other and then fixed to each other. A first hole 1210 forming the upper part of a hole 1200 may be formed in the central part of the first body 1010 and a second hole 1220 forming the lower part of the hole 1200 may be formed in the central part of the second body 1020.

Also, the body 1000 may also include a component.

Figure 4:
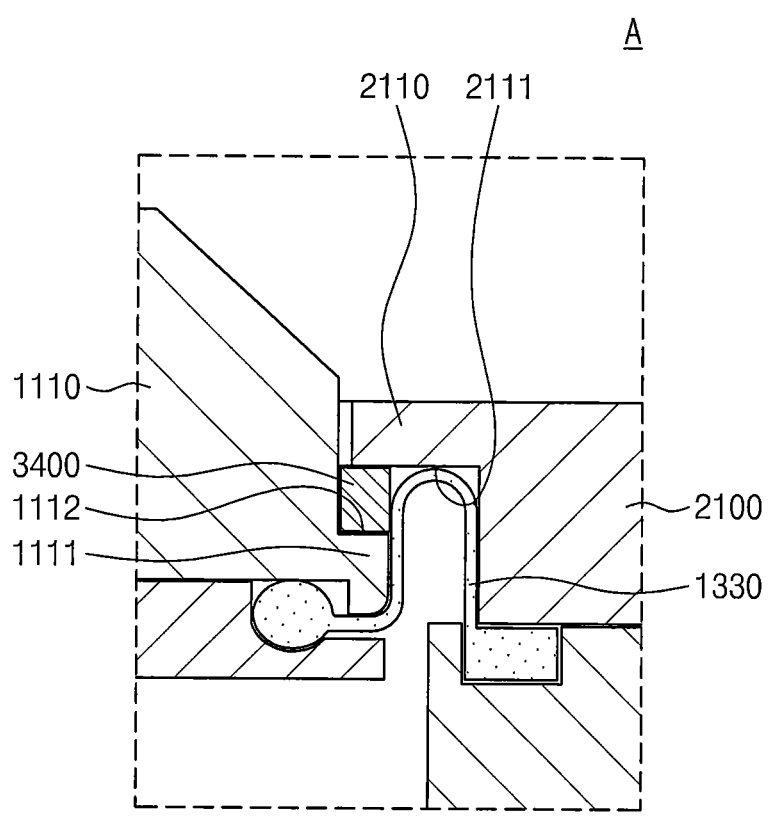
FIG. 4 is an expanded view of area A in FIG. 3.

FIG. 4 is an expanded view of area A in FIG. 3.

Referring to FIGS. 3 and 4, a first locking part 1111 is formed on the external surface of the body 1000. The first locking part 1111 may be formed on the lower part of the external surface of the first area 1110. The first locking part 1111 protrudes externally from the lower part of the external surface of the first area 1110 to be formed in a ring shape. The top of the first locking part 1111 is provided as a first coupling surface 1112. The first coupling surface 1112 supports the support unit 2000 and thus prevents the support unit 2000 from becoming separated from the body 1000. The first coupling surface 1112 may be formed to be parallel to the ground.

The support unit 2000 is elevatably coupled with the body 1000 by surrounding the lateral and lower parts of the body. The support unit 2000 may be provided in a ring shape, roughly. The support unit 2000 may be classified into an upper support area 2100 and a lower support area 2200. The internal surface of the upper support area 2100 has a shape corresponding to the external surface of the first area 1110.

When the support unit 2000 is coupled with the body 1000, the internal surface of the upper support area 2100 may be spaced at a set distance apart from the external surface of the first area 1110.

A second locking part 2110 is formed on the internal surface of the support unit 2000. The second locking part 2110 is located to be aligned vertically with the first locking part 1111 to face the first locking part 1111 and thus prevents the support unit 2000 from becoming separated from the body 1000. The second locking part 2110 may protrude internally from the upper part of the internal surface of the upper support area 2100. The second locking part 2110 may have a ring shape. The internal perimeter of the second locking part 2110 may correspond to the external perimeter of the first area 1110. The bottom of the second locking part 2110 is provided as a second coupling surface 2111. The second coupling surface 2111 may be formed to be parallel to the ground.

Figure 5:
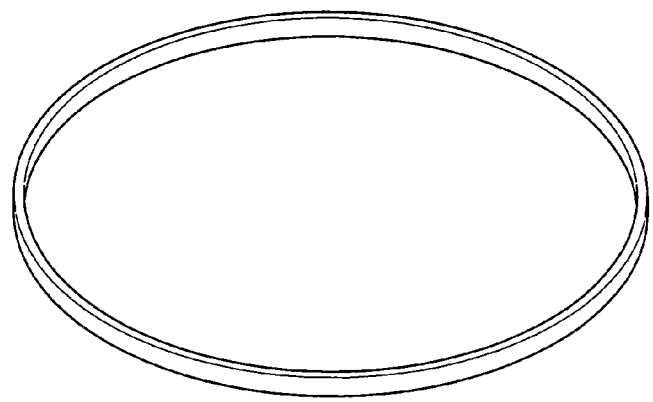
FIG. 5 is a perspective view of a first regulating member.
Figure 6:
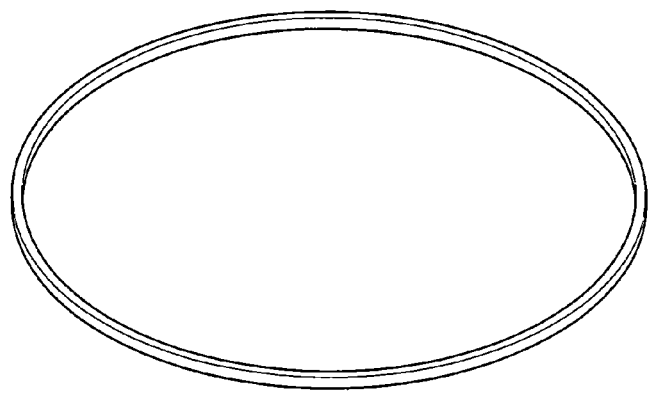
FIG. 6 is a perspective view of a second regulating member.

FIG. 5 is a perspective view of a first regulating member 3400a and FIG. 6 is a perspective view of a second regulating member 3400b.

Referring to FIGS. 4 to 6, a regulating member 3400 is located between the first locking part 1111 and the second locking part 2110. The bottom of the regulating member 3400 is supported by the first coupling surface 1112. The regulating member 3400 restricts a distance that the support unit 2000 descends relative to the body 1000. The regulating member 3400 may have a ring shape to correspond to the space between the first locking part 111 and the second locking part 2110. The internal perimeter of the regulating member 3400 may be provided to correspond to the external perimeter of the first area 1110 to be in close contact with the external surface of the body 1000. The external surface of the regulating member 3400 may have a perimeter to be able to be spaced at a set distance apart from the internal surface of the upper support area 2100.

One of a first regulating member 3400a and a second regulating member 3400b may be selected as the regulating member 3400. The first regulating member 3400a and the second regulating member 3400b are provided to have different heights. Thus, when the regulating member 3400 is replaced, a height relative to the body 1000 of the regulating member 3400 may change.

Referring back to FIG. 3, the vertical movement of the support unit 2000 is guided by the guide member 3000.

The guide member 3000 includes a guide unit 3100, a connection unit 3200 and a coupling unit 3300.

The guide unit 3100 has a cylindrical shape having a central flow path 3110. The guide member 3000 is slidably inserted into the hole 1200. The external surface of the guide member 3000 may have a perimeter corresponding to the internal surface of the hole 1200.

The connection unit 3200 is extended externally from the lower end of the guide unit 3100. The connection unit 3200 may have a ring shape. The connection unit 3200 may be formed to externally rise.

The coupling unit 3300 is extended upwards from the external top of the connection unit 3200. The coupling unit 3300 is fixed to the support unit 2000. For example, an insertion unit 3310 that is externally extended may be formed on the external surface of the coupling unit 3300. The insertion unit 3310 may be formed in a rod shape or a ring shape formed along the perimeter of the coupling unit 3300. The insertion unit 3310 may be inserted into the internal surface of the support unit 2000 to be fixed to the support unit 2000. The insertion unit 3310 may be inserted into the internal surface of the lower support area 2200.

A chamber 1300 is formed between the lower part of the body 1000 and the internal surface of the support unit 2000. The chamber 1300 is provided to be airtight. In particular, the space between the external surface of the first area 1110 and the internal surface of the upper support area 2100 is shielded by a sealing layer 1330 (FIG. 4). The sealing layer 1330 is provided as a layer formed of a flexible material and having a ring shape. The internal end of the sealing layer is fixed to the first area 1110 and the external end of the sealing layer 1330 is fixed to the upper support area 2100. The sealing layer 1330 may be fixed to the lower parts of the first coupling surface 1112 and the second coupling surface 2111 and a space in which the regulating member 400 may be formed external to the chamber 1300.

The internal lower part of the chamber 1300 is airtight by the guide member 3000. In particular, the external surface of the guide unit 3100 may be provided to be in close contact with the internal surface of the hole 1200 and the connection unit 1130 may be provided to be connected to the internal surface of the support unit 2000 so that the internal lower part of the chamber 1300 may be airtight.

The chamber 1300 may be used for regulating a level that the support unit 2000 ascends and descends relative to the body 1000. An elevating flow path 1410 connected to the chamber 1300 is formed in the body 1000. The elevating flow path 1410 is used for supplying a gas to the chamber 1300 or externally discharging a gas from the chamber 1300. Thus, when the gas from the chamber 1300 is discharged through the elevating flow path 1410, the support unit 2000 may ascend relative to the body 1000 by vacuum pressure in the chamber 1300. In addition, when the gas is supplied to the chamber 1300 through the elevating flow path 1410 to increase the pressure of the chamber 1300, the support unit 2000 may descend relative to the body 1000 until the second coupling surface 2111 is in contact with the top of the regulating member 3400.

The bottom of the support unit 2000 is provided with a membrane member 4000. The membrane member 4000 may be fixed to the support unit 2000 by fixing units 4100 to 4300 that are formed in a ring shape upwards from the top. The fixing units 4100 to 4300 may have a concentric circle shape around the center of the membrane member 4000. The fixing units 4100 to 4300 may include a central fixing unit 4200 adjacent to the center of the membrane member 4000, an external fixing unit 4100 adjacent to the external end of the membrane member 4000, and one or more secondary fixing units 4300 provided between the central fixing unit 4200 and the external fixing unit 4100. Each of the secondary fixing unit 4300 and the external fixing unit 4100 is fixed to the lower part of the support unit 2000 to form lower chambers 1310 between the support unit 2000 and the membrane member 4000. The lower chambers 1310 may be formed through division between the outermost secondary fixing unit 4300 and the external fixing unit 4100 and between the secondary fixing units 4300. The lower chambers 1310 are connected to first flow paths 1420 that is formed in the body 1000 and the support unit 2000. Although FIG. 3 shows only a first flow path 1420, one or more first flow paths 1420 may be connected to each of the lower chambers 1310. Each first flow path 1420 may supply a gas to the lower chamber 1310 so that the membrane member 4000 presses a substrate during a process. One or more ring-shaped recesses 2300 may be formed at the bottom of the support unit 2000. When a gas from the lower chamber 1310 is discharged through the first flow path 1420, the substrate may be adhered to the membrane member 4000 through vacuum pressure formed by the recess 2300.

The central fixing unit 4200 may be inserted and fixed to between the internal surface of the support unit 2000 and the guide member 3000 to enhance the airtightness of the chamber 1300. Also, the central fixing unit 4200 may be fixed to the lower part of the support unit 2000 or to the lower part of the guide member 3000. A central chamber 1320 that is formed in the central fixing unit 4200 is connected to the central flow path 3110. The central flow path 3110 may supply a gas to the central chamber 1320 so that the membrane member 4000 presses a wafer during a process.

Figure 7:
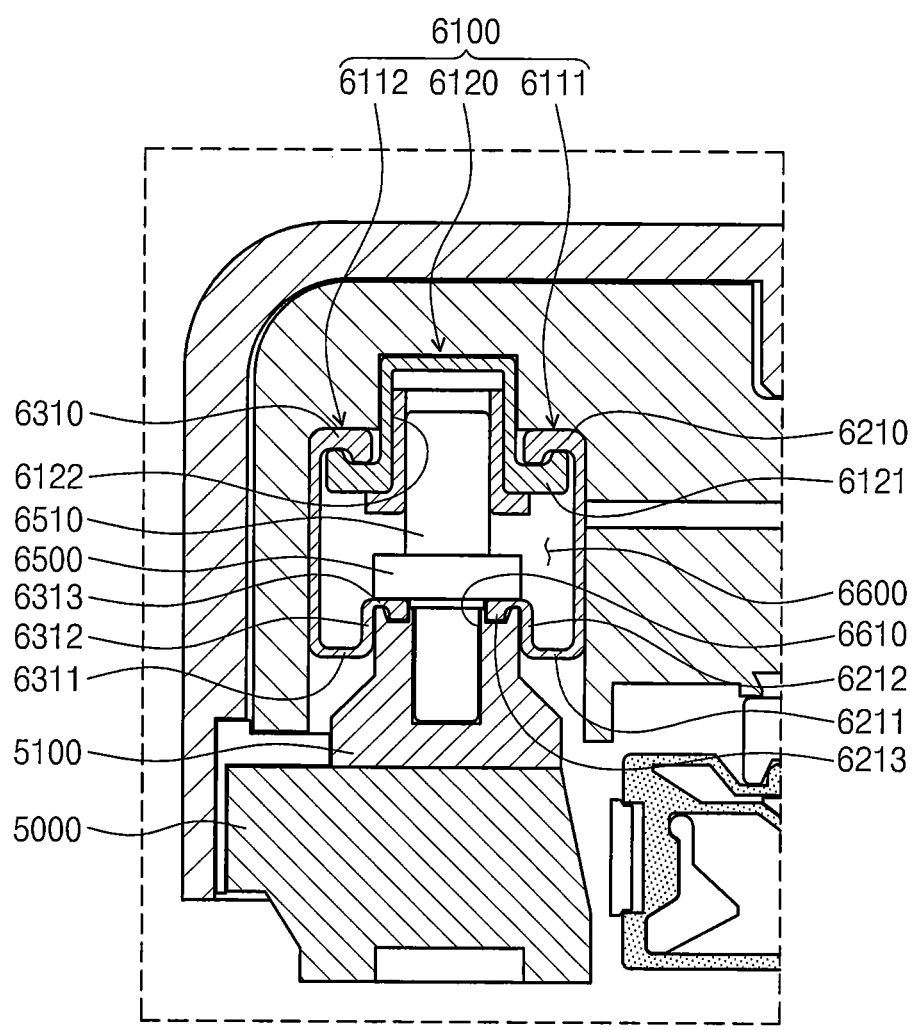
FIG. 7 is an expanded view of area B in FIG. 3.

FIG. 7 is an expanded view of area B in FIG. 3.

Referring to FIG. 7, a retainer ring 5000 is provided on the external bottom of the support unit 2000. The retainer ring 5000 has a ring shape to be located external to the membrane member 4000. The retainer ring 5000 prevents a wafer from getting out of the carrier head 141 during a process. The retainer ring 5000 is coupled with the support unit 2000 to be capable of regulating a height relative to the support unit 2000 by a elevating unit 6000.

The elevating unit 6000 is located in a storage recess 2400 on the external bottom of the support unit 2000. The storage recess 2400 has a ring shape having a set volume. The elevating unit 6000 includes a sealing member 6100 and an elevating member 6500.

The sealing member 6100 forms an elevating chamber 6600. The sealing member 6100 is generally provided in a ring shape. An opening 6610 is formed on the lower part of the elevating chamber 6600. The opening 6610 is formed in a ring shape along the lower part of the sealing member 6100. The sealing member 6100 may include sealing rings 6111 and 6112 and a cap 6120.

A first sealing ring 6111 is provided with a flexible layer having a ring shape having a perimeter corresponding to the internal perimeter of the storage recess 2400. A first coupling unit 6210 that is externally extended may be formed on the upper part of the first sealing ring 6111. A protrusion may be formed on the bottom of the end of the first coupling unit 6210. A first bent part 6211 externally extended, a first elevating part 6212 extended upwards from the end of the first bent part 6211, and a first holding part 6213 extended externally from the end of the first bent part 6211 may be formed on the lower part of the first sealing ring 6111.

A second sealing ring 6112 is provided with a flexible layer having a ring shape having a perimeter corresponding to the external perimeter of the storage recess 2400. A second coupling unit 6310 that is externally extended may be formed on the upper part of the second sealing ring 6112. A protrusion may be formed on the bottom of the end of the second coupling unit 6310. The second coupling unit 6310 may be formed to be bilaterally symmetrical to the first coupling unit 6210. A second bent part 6311 externally extended, a second elevating part 6312 extended upwards from the end of the second bent part 6311, and a second holding part 6313 extended externally from the end of the second bent part 6311 may be formed on the lower part of the second sealing ring 6112. The lower part of the second sealing ring 6112 may be formed to be bilaterally symmetrical to the lower part of the first sealing ring 6111.

The cap 6120 shields the open, upper part between sealing rings 6111 and 6112. The cap 6120 is generally provided in a ring shape. A coupling unit 6121 externally extended is formed on each of the internal surface and the external surface of the lower part of the cap 6120. A protrusion may be formed from the top of the coupling unit 6121. The cap 6120 may be coupled from the internal surface to the external surface of the elevating chamber 6600 to be fixed to the sealing rings 6111 and 6112. One or more guide recesses 6122 may be formed in a vertical direction on the bottom of the cap 6120 in the elevating chamber 6600.

Figure 8:
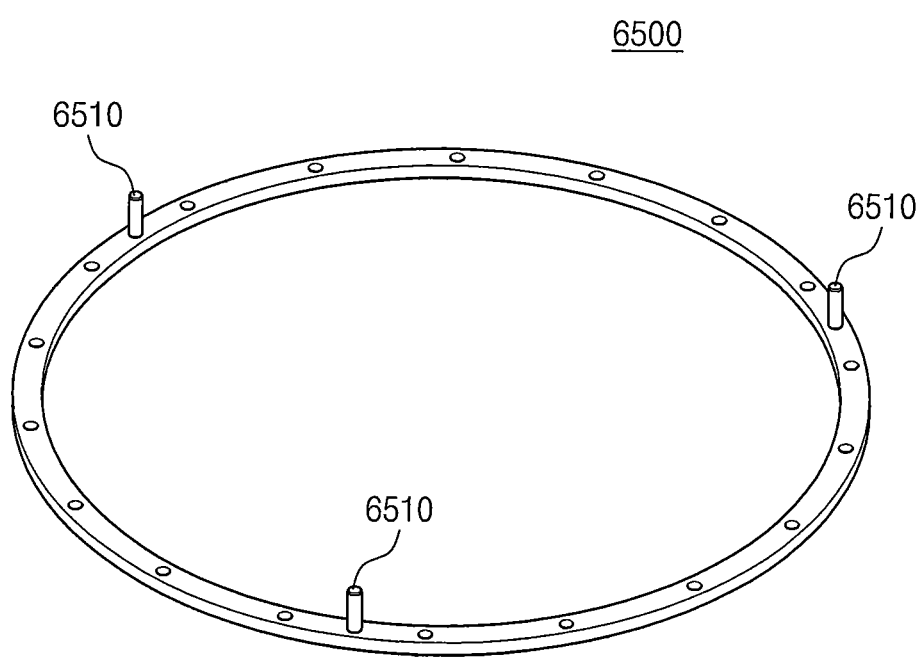
FIG. 8 is a perspective view of an elevating member.

FIG. 8 is a perspective view of an elevating member 6500.

Referring to FIG. 8, the elevating member 6500 has a ring shape corresponding to the elevating chamber 6600. The width of the elevating member 6500 is provided to be wider than that of the opening 6610. Thus, when the elevating member 6500 is located in the elevating member 6500, the bottom of the elevating member 6500 shields the opening 6610 while being located on the first and second holding parts 6213, 6313. One or more guide rods 6510 may be provided with the top of the elevating member 6500. Each guide rod 6510 has a rod shape on a location corresponding to a guide recess 6122. The guide rods 6510 guide the vertical movement of the elevating member 6500.

The elevating chamber 6600 is connected to a second flow path 1430 that is formed in the body 1000 and the support unit 2000. The second flow path 1430 supplies a gas to the elevating chamber 6600. When the gas is supplied to the elevating chamber 6600, the elevating member 6500 may move down while shielding the opening 6610. In this case, due to the elevating units 6212 and 6312 of the sealing member 6100, the elevating member 6500 may vertically move without a damage to the sealing member 6100 or the gap between the opening 6610 and the elevating member 6500.

The elevating member 6500 is connected to a towering portion 5100 on the retainer ring 5000. The towering portion 5100 may be formed in a ring shape corresponding to the storage recess 2400. The width of the upper part of the towering portion 5100 may be formed to be smaller than that of the storage recess 2400 so that the towering portion may be partially located in the storage recess 2400. Also, the width of the upper end of the towering portion 5100 may be formed to correspond to the distance between the first elevating part 6212 and the second elevating part 6312 so that the towering portion may be inserted into between the elevating units to be connected to the elevating member 6500. Also, the first and second holding parts 6213, 6313 may be forcibly inserted into and fixed to between the upper end of the towering portion 5100 and the bottom of the elevating chamber 6600. Thus, it is possible to prevent the elevating chamber 6600 from becoming opened when the elevating member 6500 goes up.

Figure 9:
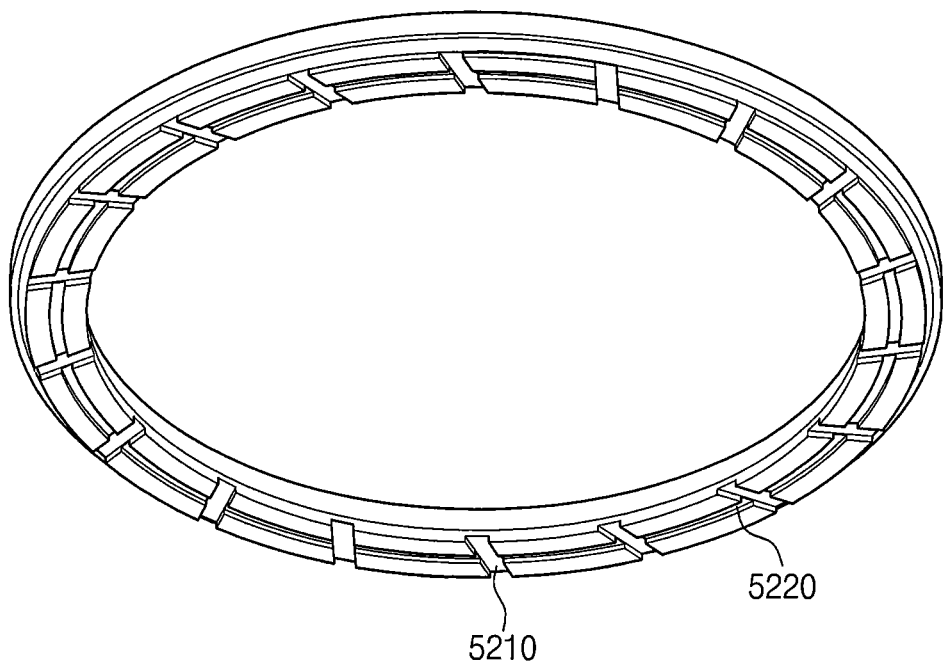
FIG. 9 is a bottom, perspective view of a retainer ring.

FIG. 9 is a bottom, perspective view of a retainer ring 5000.

Referring to FIG. 9, supply recesses 5210 and buffer recesses 5220 are formed on the bottom of the retainer ring 5000.

The supply recesses 5210 are formed across the parametrical direction of the retainer ring 5000 so that the internal surface and external surface of the retainer ring 5000 are formed. Slurry supplied to the polishing pad 131 through a slurry supply arm 132 may flow into the retainer ring 5000 through the supply recesses 5210.

The buffer layers 5220 are formed in a direction crossing a direction in which the supply recesses 5210 are formed. For example, the buffer recesses 5220 may be formed in a circumferential direction having a concentric circle relative to the parametrical direction of the retainer ring 5000. Both ends of each of the buffer recesses 5220 may be connected to adjacent supply recesses 5210.

Figure 10:
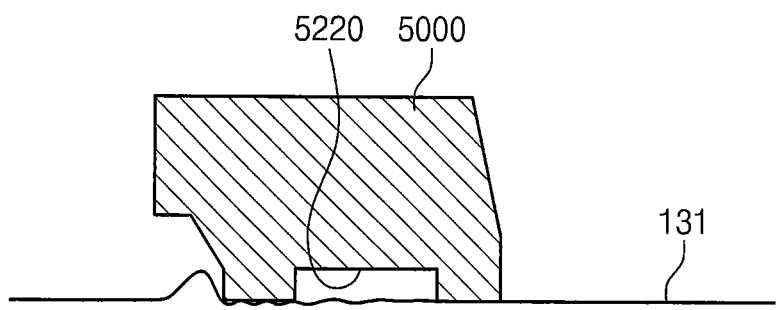
FIG. 10 is a longitudinal, sectional view of a retainer ring on a polishing pad.

FIG. 10 is a longitudinal, sectional view of a retainer ring 5000 on a polishing pad 131.

Referring to FIG. 10, wrinkles are generated on the surface of the polishing pad 131 due to collision with the side of the retainer ring 5000 or friction with the corner and bottom of the retainer ring 5000. Wrinkles are first generated at the front end at which the polishing pad 131 and the retainer ring 5000 go into contact. Wrinkles are delivered to the other side of the retainer ring 5000 through collision with the bottom of the retainer ring 5000. Such wrinkles change the height of the polishing pad 131 relative to a wafer to cause non-uniformity in polishing degree of the wafer.

On the contrary, the buffer recesses 5220 form a section having no collision between the wrinkle and the bottom of the retainer ring 5000 and thus blocks wrinkles generated at the front end of the buffer recesses 5220 from becoming delivered to the other side. Also, the buffer recesses 5220 decrease a contact area between the bottom of the retainer ring 5000 and the polishing pad 131 to decrease wrinkles due to friction. Also, the buffer recesses 5220 decrease the contact area between the bottom of the retainer ring 5000 and the polishing pad 131 to decrease the deformation of the polishing pad 131 due to friction and the wear of the retainer ring 5000.

Figure 11:
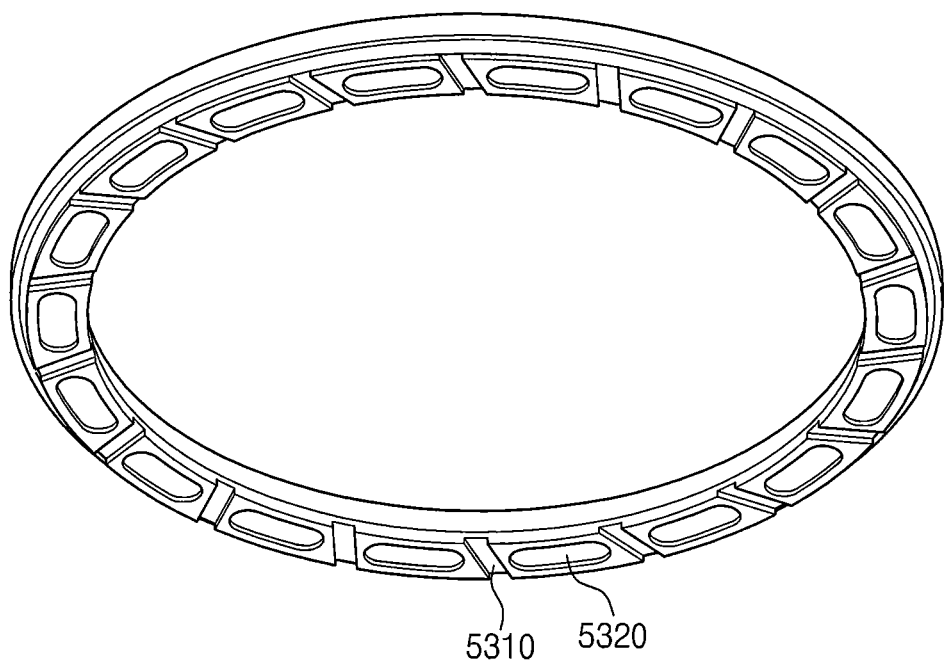
FIG. 11 is a bottom, perspective view of a retainer ring according to another embodiment.

FIG. 11 is a bottom, perspective view of a retainer ring 5000b according to another embodiment.

Referring to FIG. 11, buffer recesses 5320 may be formed between adjacent supply recesses 5310. The buffer recess 5320 is formed to be distinct from the supply recesses 5310. The buffer layers 5320 are formed in a direction crossing a direction in which the supply recesses 5310 are formed. For example, the buffer recesses 5320 may be formed in a circumferential direction having a concentric circle relative to the parametrical direction of a retainer ring 5000b. The buffer recesses 5320 may have a shape such as a circular, elliptical or polygonal shape.

The supply recesses 5310 may be formed to be the same or similar to the supply recesses 5310 on the retainer ring 5000 of FIG. 9.

Figure 12:
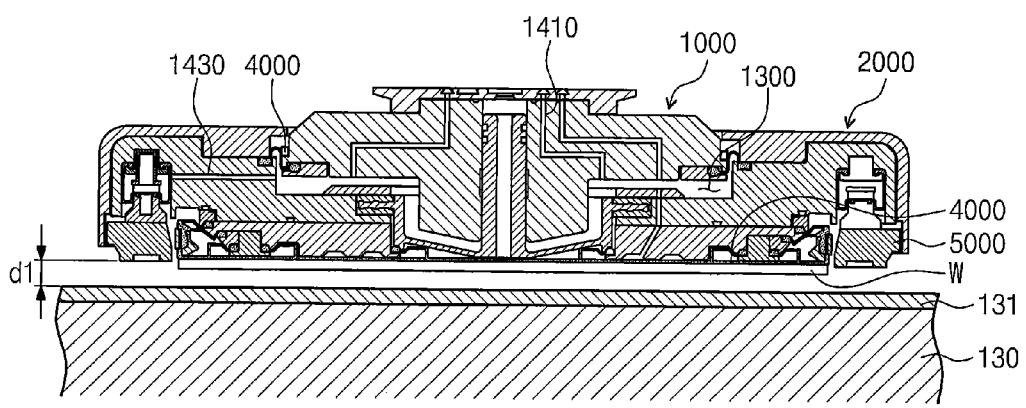
FIGS. 12 to 14 illustrate the operation of a carrier head during a process.
Figure 13:
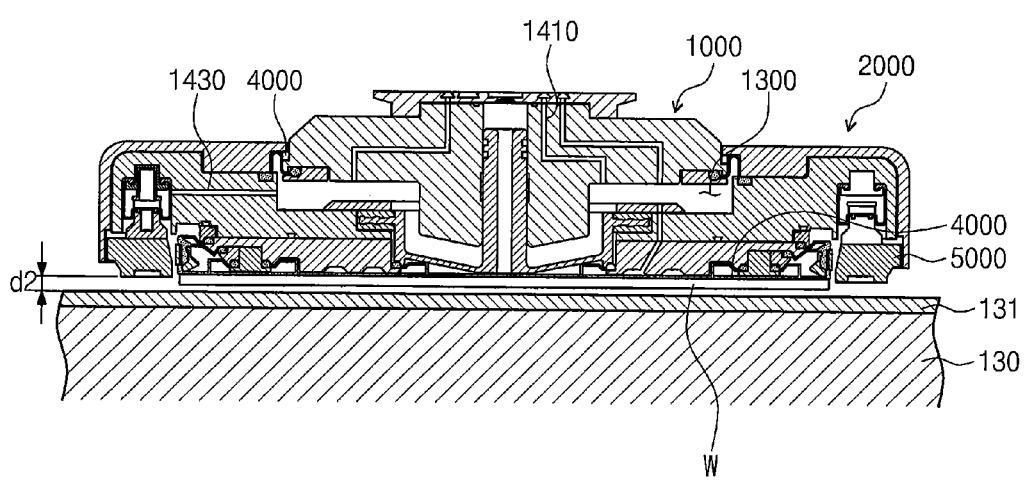
Figure 14:
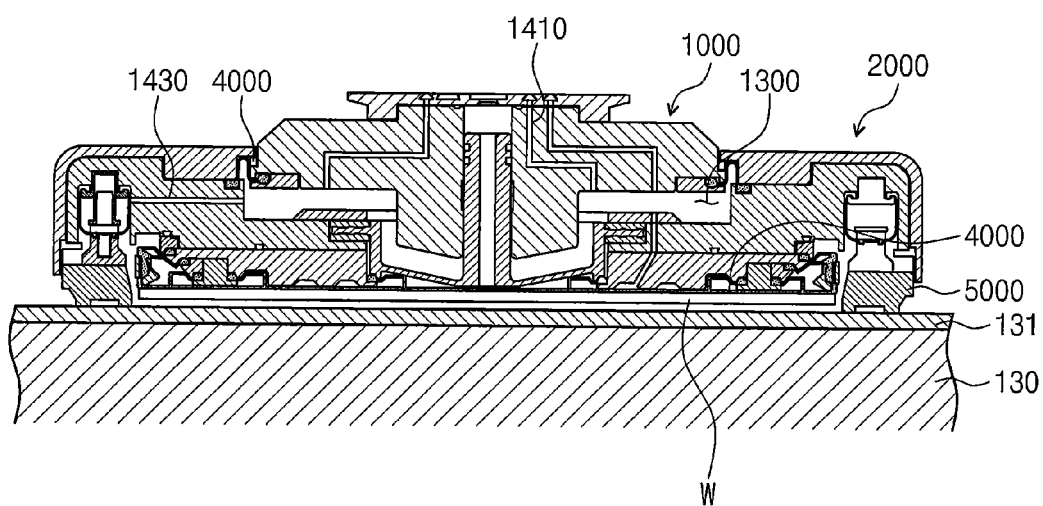

FIGS. 12 to 14 illustrate the operation of a carrier head 141 during a process.

Referring to FIGS. 12 to 14, the carrier head 141 adhering a wafer to the bottom of the membrane member 4000 is aligned on a location spaced at a first set distance d1 apart from the top of the polishing pad 131.

Then, when a gas is supplied to the chamber 1300 through the elevating flow path 1410, the support unit 2000 descends relative to the body 1000. The support unit 2000 descends to a height at which the second locking part 2110 is supported on the top of the regulating member 3400, and is located so that the retainer ring 5000 is spaced at a second set distance d2 apart from the top of the polishing pad 131. In this case, the regulating member 3400 may be selected between the first regulating member 3400a and the second regulating member 3400b in order to regulate the second set distance d2 in consideration of the characteristic of a polishing process. Also, in order to maintain the second set distance d2 within a certain range in consideration of the wear of the retainer ring 5000 due to the usage of the carrier head 141, it is also possible to select between the first regulating member 3400a and the second regulating member 3400b.

After the support unit 2000 descends, the second flow path 1430 supplies a gas to the elevating chamber 6600 to descend the retainer ring 5000 to the top of the polishing pad 131. When the retainer ring 5000 has descended, the carrier head 141 presses a wafer relative to the polishing pad 131 through the membrane member 4000 to perform a process.

According to an embodiment of the present invention, it is possible to provide a carrier head that may efficiently support a wafer during a polishing process, a chemical, mechanical polishing apparatus, and a wafer polishing method.

The detailed descriptions above show examples of the present invention. Also, the above description represents exemplary embodiments and the present invention may be used under various different combinations, changes and environments. That is, it is possible to make a change or modification within the scope of the concept of the invention disclosed herein, within a scope equivalent to the disclosure and/or within the scope of the technique or knowledge of the related art. The above-described embodiments are provided with best mode for implementing the technical spirit of the present invention and various changes needed for the particular applications and use of the present invention may also be implemented. Thus, the detailed description of the invention is not intended to limit the present invention to the embodiments disclosed. Also, the following claims should be construed to include other embodiments.

What is claimed is:

1. A carrier head comprising:
    a body having a ring shape, wherein a first locking part is formed on an external surface of the body;
    a support unit surrounding lateral and lower parts of the body to be elevatably coupled to the body, wherein a second locking part vertically facing the first locking part is formed on an internal surface of the support unit;
    a regulating member located in a space between the first locking part and the second locking part;
    a retainer ring having a ring shape and located at an external bottom of the support unit; and
    an elevating unit coupling the retainer ring to the support unit to enable a height of the retainer ring to be regulated relative to the support unit.

2. The carrier head of claim 1, wherein the first locking part protrudes externally from the external surface of the body, and
    the regulating member has a set height and is located on a first coupling surface provided on a top of the first locking part.

3. The carrier head of claim 2, wherein the support unit enables a second coupling surface on a bottom of the second locking part to contact a top of the regulating member.

4. The carrier head of claim 2, wherein the regulating member has a ring shape.

5. The carrier head of claim 4, wherein an internal surface of the regulating member has a shape corresponding to a perimeter of a part of the body at which the first locking part is arranged.

6. The carrier head of claim 1, wherein the elevating unit comprises:
    a sealing member located at a lower part of the support unit to form an elevating chamber, the elevating chamber being a space having an opening; and
    an elevating member located in the elevating chamber and connected to the retainer ring through the opening.

7. The carrier head of claim 6, wherein the elevating member has a ring shape, and
    a guide rod having a rod shape is arranged on a top of the elevating member.

8. The carrier head of claim 7, wherein the sealing member comprises:
    a first sealing ring, wherein an upper part of the first sealing ring is bent;

a second sealing ring having a larger circumference than the first sealing ring and located outside the first sealing ring, wherein an upper part of the second sealing ring is bent; and a cap shielding an upper space between the first sealing ring and the second sealing ring.

9. The carrier head of claim 8, wherein a first bent part bent, a first elevating part bent upwards from an end of the first bent part and a first holding part bent from an end of the first elevating part are formed on a lower part of the first sealing ring, and a second bent part bent, a second elevating part bent upwards from an end of the second bent part and a second holding part bent from an end of the second elevating part are formed on a lower part of the second sealing ring.

10. The carrier head of claim 9, wherein a width of the elevating member is formed to be larger than a width of the opening and the elevating member is located on a top of the first holding part and on a top of the second holding part.

11. The carrier head of claim 7, wherein a guide recess being a space for storing the guide rod is formed in an internal top of the sealing member.

12. The carrier head of claim 6, further comprising:

a membrane coupled to a bottom of the support unit to be located inside the retainer ring;

a first flow path configured to supply a gas to a space between the membrane and the support unit or to discharge the gas from the space; and a second flow path connected to the elevating chamber separately from the first flow path.

13. A carrier head, comprising:

a body comprising a first locking part formed on an external surface of the body;

a support unit surrounding the body and elevatably coupled to the body, wherein the support unit comprises a second locking part formed on an internal surface of the support unit;

a retainer ring located at an external bottom of the support unit;

an elevating unit coupling the retainer ring to the support unit to enable a height of the retainer ring to be regulated relative to the support unit;

a membrane coupled to the external bottom of the support unit and located inside the retainer ring; and a first flow path configured to supply a gas to a space between the membrane and the support unit and to discharge the gas from the space.

14. The carrier head of claim 13, wherein the elevating unit comprises:

a sealing member that forms an elevating chamber having an opening; and an elevating member positioned in the elevating chamber and connected to the retainer ring through the opening.

15. The carrier head of claim 14, further comprising a second flow path connected to the elevating chamber separately from the first flow path.

16. The carrier head of claim 14, further comprising at least one guide rod arranged on a top of the elevating member.

17. The carrier head of claim 16, further comprising at least one guide recess formed in an internal top of the sealing member, and wherein the at least one guide rod is located within the at least one guide recess.

* * * * *